(12) United States Patent
Spaeth

(10) Patent No.: US 10,141,949 B1
(45) Date of Patent: Nov. 27, 2018

(54) MODULAR SERIALIZER AND DESERIALIZER

(71) Applicant: Cavium, LLC, Santa Clara, CA (US)

(72) Inventor: Mark Spaeth, Marlborough, MA (US)

(73) Assignee: Cavium, LLC, Santa Clara, CA (US)

( * ) Notice: Subject to any disclaimer, the term of this patent is extended or adjusted under 35 U.S.C. 154(b) by 0 days.

(21) Appl. No.: 15/805,631

(22) Filed: Nov. 7, 2017

(51) Int. Cl.
| H03M 9/00 | (2006.01) |
| G06F 13/40 | (2006.01) |
| G06F 13/42 | (2006.01) |
| H04B 1/16 | (2006.01) |
| H03L 7/08 | (2006.01) |

(52) U.S. Cl.
CPC .......... *H03M 9/00* (2013.01); *G06F 13/4022* (2013.01); *G06F 13/4291* (2013.01); *G06F 2213/0026* (2013.01); *H03L 7/0807* (2013.01); *H04B 1/16* (2013.01)

(58) Field of Classification Search
CPC ............... H03M 9/00; H03M 13/2703; H03M 13/2782; H03M 7/40
USPC ................................................... 341/100, 101
See application file for complete search history.

(56) References Cited

U.S. PATENT DOCUMENTS

| 5,982,309 | A | * | 11/1999 | Xi | ........................... | H03M 9/00 341/101 |
| 6,052,073 | A | * | 4/2000 | Carr | ........................ | H03M 9/00 341/100 |
| 6,768,431 | B2 | * | 7/2004 | Chiang | ................... | H03M 9/00 341/100 |
| 7,310,057 | B2 | * | 12/2007 | Murata | .................... | H03M 9/00 341/101 |
| 7,619,547 | B2 | * | 11/2009 | Yamagata | ............ | G09G 3/2096 341/100 |
| 7,990,293 | B2 | * | 8/2011 | Luo | ......................... | H03M 9/00 341/100 |
| 2008/0169946 | A1 | * | 7/2008 | Shin | ....................... | H03K 5/135 341/100 |
| 2008/0187084 | A1 | * | 8/2008 | Lim | ....................... | H03K 5/135 375/371 |
| 2009/0096644 | A1 | * | 4/2009 | Fukuhisa | ............... | G11C 19/00 341/100 |
| 2009/0167573 | A1 | * | 7/2009 | Kim | ....................... | H03K 5/135 341/100 |
| 2011/0122002 | A1 | * | 5/2011 | Tsunoda | .................. | H03M 9/00 341/101 |
| 2012/0154186 | A1 | * | 6/2012 | Hassan | ................... | H03M 9/00 341/100 |

* cited by examiner

*Primary Examiner* — Linh Nguyen
(74) *Attorney, Agent, or Firm* — Hamilton, Brook, Smith & Reynolds, P.C.

(57) ABSTRACT

Modular serializer and deserializer circuits convert a data input in a variety of applications. The serializer includes an array of cells that receive a parallel data input and transfer the word, row by row, to an output buffer that generates a corresponding serial data output. The deserializer includes an input buffer that receives a serial data input and transfers partial words sequentially through an array of cells. When the word fully occupies the cells, the array transmits the word as a parallel data output. A modular clock operates to clock the modular serializer and deserializer.

26 Claims, 13 Drawing Sheets

MODULAR SERIALIZER AND DESERIALIZER

BACKGROUND

Driven by the fast advancement of applications in several fields of technology, such as cloud computing, autonomous vehicle, and virtual reality, the demand for increasing data throughput is greater than ever before. A typical hardware platform often employs multi-Gbps serial data links, such as PCI express, Ethernet, and serial ATA (SATA). The challenge for transferring data at such high speed with low-cost hardware, such as an FR4 Printed Circuit Board (PCB), is that a transmission channel through which the data is transferred, can cause severe inter-symbol interference (ISI) as a result of being high-loss, non-linear, and/or reflective. ISI degrades the data received by a receiver, such as a serializer/deserializer (SerDes) receiver, where the degradation can include reduced eye height and eye width of the received data signal. Such degradation can increase at higher speeds of data transfer, leading to errors in the sampling of the data signal.

SUMMARY

Example embodiments include a deserializer circuit comprising an input buffer and an array of cells. The input buffer is configured to receive a serial data signal. Each cell of the array of cells may include an input flip-flop and an output flip-flop, and the array may include a bottom row, one or more intermediary rows, and a top row. The bottom row of cells may be configured to receive a plurality of partial words in parallel from the input buffer to the input flip-flops of the bottom row of cells, the plurality of partial words corresponding to the serial data signal. The one or more intermediary row of cells may be configured to 1) receive the plurality of partial word from a preceding row of cells, and 2) transfer a subset of the plurality of partial words to a successive row of cells of the array of cells. The top row of cells may be configured to receive one of the plurality of partial words from a preceding row of cells. Upon loading each row of the array of cells with a partial word, the array of cells may then output the corresponding word in parallel via the output flip-flops of each cell.

In further embodiments, the input buffer and array of cells may be grouped into a plurality of pipes, each pipe receiving a portion of the serial data signal in an alternating sequence. The plurality of pipes may include first and second pipes, where the first pipe configured to receive the serial data signal at a first clock edge, and the second pipe is configured to receive the serial data signal at a second clock edge immediately succeeding the first clock edge.

In still further embodiments, the input buffer may include a row of flip-flops connected serially via respective inputs and outputs. The flip-flops of the input buffer may be clocked by a first clock signal and the flip-flops of the array of cells may be clocked by a second clock signal, where the first clock signal may have a frequency higher than and a multiple of that of the second clock signal. The multiple may be a value corresponding to the number of flip-flops of the input buffer.

A clock generator may be configured to generate the second clock signal, the clock generator including first and second rows of flip-flops and a controller. The first row of flip-flops may be connected serially and clocked by the first clock signal. The second row of flip-flops may be connected serially and clocked by a signal corresponding to an output of the first row of flip-flops. The controller may be configured to 1) output the second clock signal as a function of at least one output of the first row of flip-flops, and 2) output a third clock signal (and, optionally, additional clock signals) as a function of at least one output of the second row of flip-flops. The array of cells outputs the word as a function of the third clock signal.

In yet further embodiments, the circuit may include a supplemental row of flip-flops configured to receive the plurality of partial words in parallel from the input buffer and output the plurality of words successively. The input buffer may include a row of n flip-flops and the array of cells includes n rows of m cells, where m*n equals the number of bits in the word. The input buffer may include flip-flops configured to operate at a rate of at least 10 GHz, and the array of cells may include flip-flops configured to operate at a rate lower than that of the flip-flops of the input buffer.

Further embodiments include a serializer circuit having an array of cells and an output buffer. The array of cells may each comprise a flip-flop, and a top row of cells may be configured to 1) receive a first partial word in parallel from a parallel data input and 2) transfer the first partial word in parallel to a successive row of the array. One or more intermediary row of cells may be configured to 1) receive a second partial word from the parallel data input, 2) transfer the second partial word to a successive row of the array, and 3) transfer the first partial word from a preceding row of the array to the successive row of the array. A bottom row of cells may be configured to 1) receive a third partial word from the parallel data input and 2) receive a plurality of partial words, including the first and second partial words, in parallel from a preceding row of the array. The output buffer may be configured to receive the plurality of words in parallel and sequentially from the bottom row of cells, the output buffer serially outputting a word corresponding to the plurality of partial words.

In further embodiments, the output buffer and array of cells may be grouped into a plurality of pipes, each pipe receiving a portion of the word via the parallel data input. The plurality of pipes may include first and second pipes, the first pipe configured to transmit a first portion of the word serially at a first clock edge, the second pipe configured to transmit a second portion of the word serially at a second clock edge immediately succeeding the first clock edge.

The output buffer may include a row of flip-flops connected serially via respective inputs and outputs. The flip-flops of the output buffer may be clocked by a first clock signal and the flip-flops of the array of cells may be clocked by a second clock signal, where the first clock signal having a frequency higher than and a multiple of a frequency of the second clock signal. The multiple may be a value corresponding to the number of flip-flops of the input buffer.

A clock generator may be configured to generate the second clock signal, the clock generator including first and second rows of flip-flops and a controller. The first row of flip-flops may be connected serially and clocked by the first clock signal. The second row of flip-flops may be connected serially and clocked by a signal corresponding to an output of the first row of flip-flops. The controller may be configured to 1) output the second clock signal as a function of at least one output of the first row of flip-flops, and 2) output a third clock signal as a function of at least one output of the second row of flip-flops. The array of cells may output the word as a function of the third clock signal.

In yet further embodiments, the array of cells may receive the plurality of partial words as a function of the third clock signal. A subset of the plurality of cells may further include a multiplexer configured to switch an output between the parallel data input and an output of a cell of a preceding row, the multiplexer transferring the output to and input of the respective flip-flop. The output buffer may include a row of n flip-flops and the array of cells includes m rows of n cells, where m*n equals the number of bits in the word. The output buffer may include flip-flops configured to operate at a rate of at least 10 GHz, and the array of cells may include flip-flops configured to operate at a rate lower than that of the flip-flops of the output buffer.

Further embodiments include a deserializer circuit comprising an input buffer and an array of cells. The input buffer may be configured to latch a plurality of partial words in succession from a serial data signal. The an array of cells may include, at each cell, an input flip-flop and an output flip-flop, the array of cells being configured to receive the plurality of partial words in succession from the input buffer to the input flip-flops, the array of cells being further configured to output a word in parallel via the output flip-flops, the word corresponding to the plurality of partial words. The input buffer may include a row of n flip-flops and the array of cells includes n rows of m cells, where m*n equals the number of bits in the word.

Further embodiments may include a serializer circuit, comprising and array of cells and an output buffer. Each cell of the array may include a flip-flop, the array of cells being configured to receive a plurality of partial words in parallel, each row of the array of cells latching a respective one of the plurality of partial words. The output buffer may be configured to receive the plurality of words in parallel and sequentially from a bottom row of the array of cells, the output buffer serially outputting a word corresponding to the plurality of partial words. The output buffer may include a row of n flip-flops and the array of cells includes m rows of n cells, where m*n equals the number of bits in the word.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Figure 1:
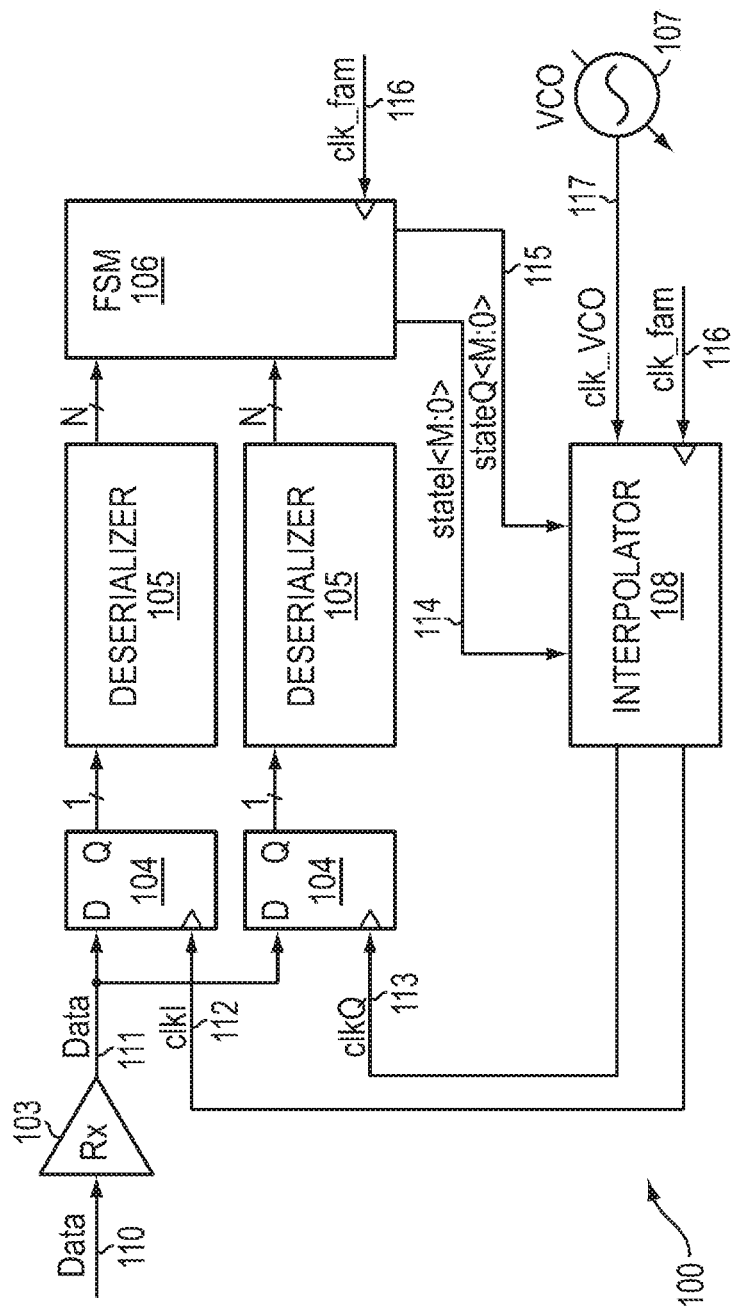
FIG. 1 is a block diagram of a receiver and clock and data recovery (CDR) circuit in which example embodiments may be implemented.

FIG. 1 is a block diagram of a receiver and clock and data recovery (CDR) circuit 100 in which example embodiments may be implemented. The circuit 100 may receive a serial data input 110 to a buffer 103, obtaining buffered data 111. The circuit 100 may be implemented as a Delay-Locked Loop (DLL) using a multi-phase voltage-controlled oscillator (VCO) 107 that generates a clock signal, clk_vco 117, as the local reference and an interpolator 108 (e.g., phase interpolator) to adjust the local clock frequency 117 to match the received clock frequency.

A Finite State Machine (FSM) 106 uses a combination of either serial data (received from flip-flops 104) or parallel received data (received from deserializers 105), edge 112 or data 113 and edge 112 information to control the phase interpolator states, stateI<M:0> 114 and stateQ<M:0> 115, to match the local clock frequency 117, the PI outputs clk1 112 (clk1 112 being considered as the recovered clock, clk1 112 being at approximately the same frequency as clk_vco 117) and clkQ 113, to the received clock frequency. The interpolator 108 and FSM 106 may also require an FSM clock 116 (clk_fsm) which may be a divided down version of the clk_vco 117 with an offset, or a divided down version of the clk1 112 or the clkQ 113.

Figure 2:
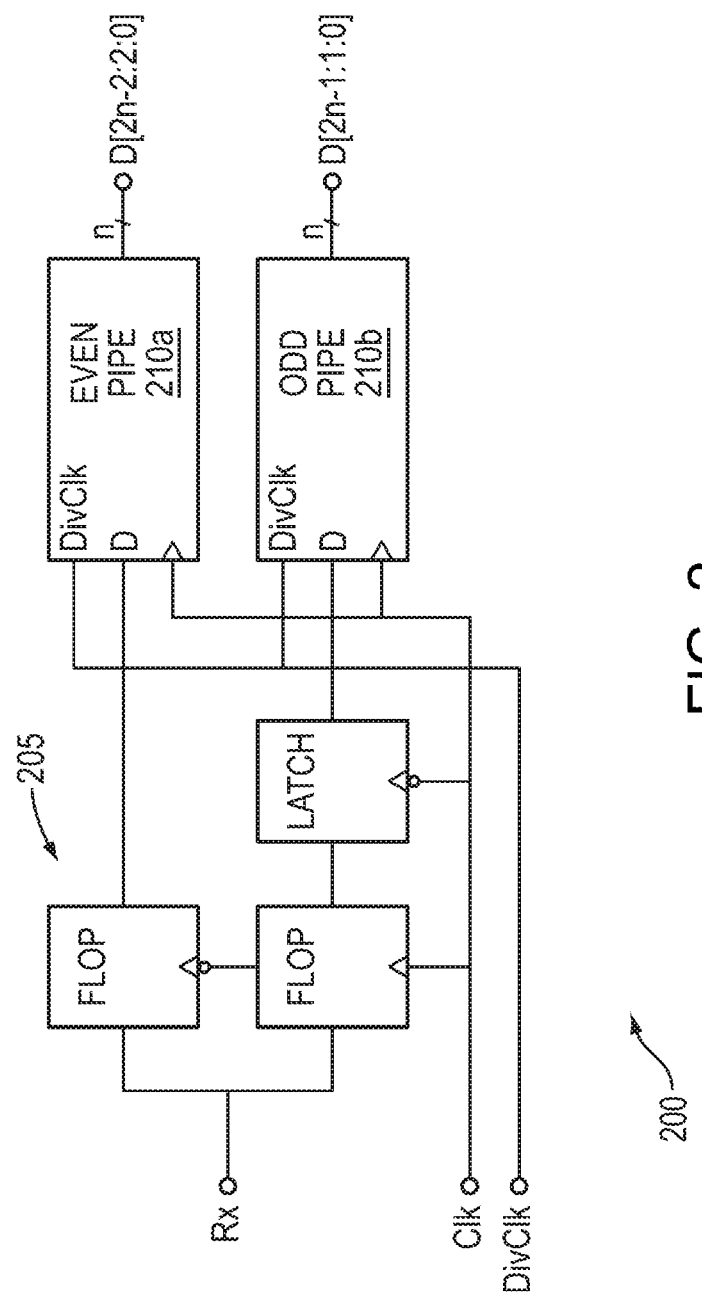
FIG. 2 is a circuit diagram of a deserializer in which example embodiments may be implemented.

FIG. 2 is a circuit diagram of a deserializer circuit 200 that may be implemented in the CDR circuit 100 of FIG. 1. The circuit 200 receives a serial data signal Rx to a latch assembly 205, including flip-flops and a latch, at two parallel channels. Under a half-rate architecture, the data signal Rx is deserialized at a distinct "pipe" at each of the two channels, where an "even" pipe 210a and an "odd" pipe 210b deserialize data occurring on opposite clock edges of the data signal Rx. In order to align the timing of the data signal Rx at each pipe, the latch assembly may include an additional latch at one channel as shown.

The pipes 210a-b may be clocked by clock signal Clk to latch the serial data signal Rx, where Clk has a frequency that is half of the full data rate, and equal to the data rate at each pipe. A divided clock signal DivClk, having a frequency divided down from Clk, may clock the parallel output at each pipe 210a-b. Accordingly, the even and odd pipes 210a-b deserialize a portion of the serial data signal Rx and output, in parallel, a respective portion of a "word" (D[2n−2:2:0] and D[2n−1:2:1]) corresponding to the data signal. The word may have a length equal to the number of bits output by the pipes 210a-b in parallel (e.g., 2n). Alternative embodiments may employ a single pipe, full-rate architecture for outputting the word.

A typical deserializer pipe may include an input buffer and an output buffer. The input buffer may be comprised of a number of flip-flops connected in series, which receives the serial data input. Specifically, bits of the serial data input are clocked into the input buffer at a rate corresponding to that of the half-rate serial data transmission. When a word is fully latched by the input buffer, it is transferred to the output buffer, which, in turn, outputs the word in parallel. The output buffer includes a number of flip-flops each connected to a respective flip-flop of the input buffer, and each flip-flop outputs a respective bit of the word.

The typical deserializer described above exhibits a number of drawbacks. In order to latch an entire word, the input buffer must have a number of flip-flops equal to the number of bits of the word. Likewise, the output buffer must have the same number of flip-flops in order to output the word in parallel. The input flip-flops must operate at a clock rate matching the rate of the serial data transmission. To meet this timing requirement for higher-speed data transmission (e.g., 25 GHz), the input buffer must be implemented using "fast" flip-flops, which are larger and require more power to operate. The output buffer, in contrast, may be operated by smaller, lower-power "slow" flip-flops due to the lower rate of the data output (i.e., a rate being a fraction of the serial data rate). Yet the requirement of several fast flip-flops at the input buffer can result in excessive power consumption and occupation of on-chip space. Moreover, if the deserializer is configured to operate with multiple different word sizes, then the input buffer must be large enough to accommodate the largest of the multiple words. Thus, even when operating with smaller words, the typical deserializer may require a large number of "fast" flip-flops.

Figure 3A:
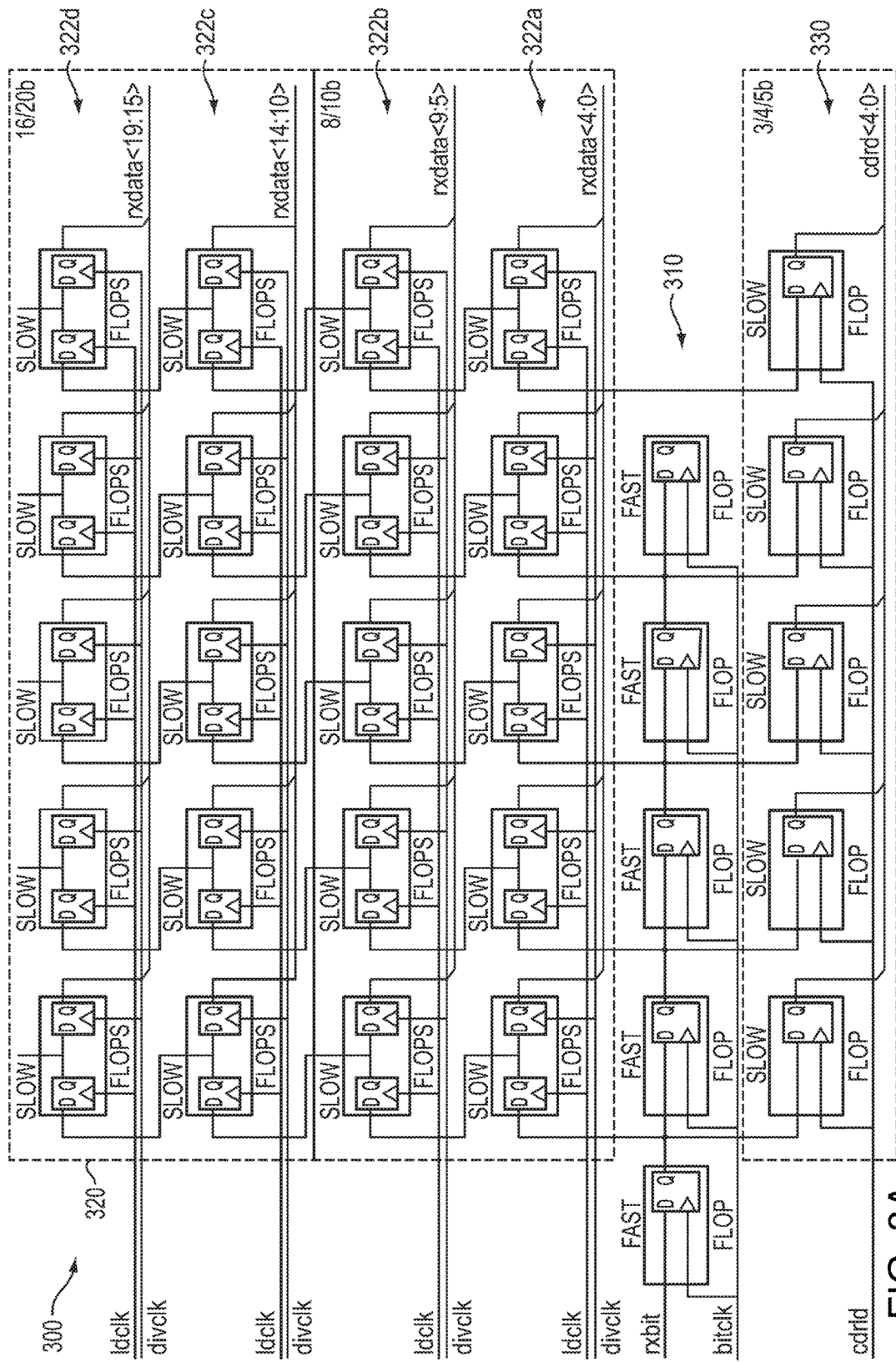
FIG. 3A is a circuit diagram of a deserializer in one embodiment.

FIG. 3A is a circuit diagram of a deserializer circuit 300 in one embodiment. The deserializer 300 may be implemented in the CDR circuit 100 of FIG. 1, as well as in one or both of the deserializer pipes 210a-b of FIG. 2. An input buffer 310, which includes a number of flip-flops connected in series, receives a serial data input signal rxbit. The flip-flops of the input buffer 310 may be clocked by a clock signal bitclk having a rate equal or comparable to the rate of the serial data input. The input buffer 310 may receive and latch a partial word (i.e., a portion of a full word to be transmitted in parallel) from the serial data input, and the partial word may occupy some or all of the flip-flops of the input buffer 310.

Once the partial word is latched, the input buffer may then transfer the partial word to an output array 320. The output array 320 may comprise a plurality cells arranged in m rows 322a-d, where each row may have a width of n cells matching the number of flip-flops of the input buffer 310. Although the array 320 as shown is configured such that m=4 and n=5, the array 320 and input buffer 310 may be configured to include rows and columns of different sizes to accommodate different operational parameters, as described in further detail below. Each cell of the array 320 may include an input flip-flop and an output flip-flop. The first row 322a of the array 320 is communicatively coupled to the input buffer 310 such that the input-flip-flop of each cell is connected to latch an output of a respective flip-flop of the input buffer. Likewise, each successive row 322b-d of the array 320 may receive and latch, to its input flip-flops, the output of the input flip-flops of the preceding row (e.g., the input flip-flops of row 322b latch the output of the input flip-flops of row 322a). The output buffers of each cell, in contrast, provide the parallel word output of the deserializer.

Thus, in order to load a word into the array 320 for transmission, the input buffer 320 may receive multiple partial words of the word and transfer the partial words successively to the first row 322a of the array 320. The partial words may be transferred, from row to row, up the array 320 until each active row 322a-d has latched a respective partial word. (Alternatively, some rows or columns may be ignored or deactivated depending on the word size, as described below.) Once the array 320 has latched all partial words making up the word, each cell may then transfer its word bit from the input flip-flop to the output flip-flop, which, in turn, outputs the word as a parallel output signal rxdata.

In some embodiments, the deserializer circuit 300 may also include a supplemental buffer 330. For applications such as in CDR circuits (e.g. the CDR 100 of FIG. 1), it may be beneficial to transmit partial words more quickly upon receipt, in addition to transmitting the complete word as described above. Accordingly, the supplemental buffer 330 may comprise a row of flip-flops communicatively coupled to the input buffer 310 comparably to the first row 322a of the array 320. Upon receipt and latching of each partial word, the supplemental buffer 330 may then output the partial word as a parallel data signal cdrd.

In further embodiments, two or more of the circuits 300 may be implemented in respective pipes of a deserializer system, such as the pipes 210a-b described above with reference to FIG. 2. In such an implementation, under the half-rate architecture described above, the even and odd pipes 210a-b may each employ a separate embodiment of the circuit 300 to deserialize a portion of the serial data signal Rx and output, in parallel, a respective portion of the word (D[2n−2:2:0] and D[2n−1:2:1]) corresponding to the data signal. The word may have a length equal to the number of bits output by the pipes 210a-b in parallel (e.g., 2n). Thus, the two circuits 300 of the respective pipes 210a-b may deserialize data occurring on opposite clock edges of the data signal Rx. In such an embodiment, the word output by each of the plural circuits 300 may be a portion of the total parallel output (which may also be considered a "word"), which is combined with the output of the other deserializer circuit(s) to provide the complete parallel output signal. In further embodiments, one or more serial data signals may be divided among a plurality of deserializer circuits such as the circuit 300, and the outputs of the plurality of deserializer circuits may be combined to constitute the parallel data output. By implementing a half-rate or other divided rate architecture (e.g., quarter-rate architecture), the plural deserializer circuits may be configured to deserialize successive bits of a serial data signal in an alternating manner, enabling a deserializer system to operate with higher rate serial data signals.

Figure 3B:
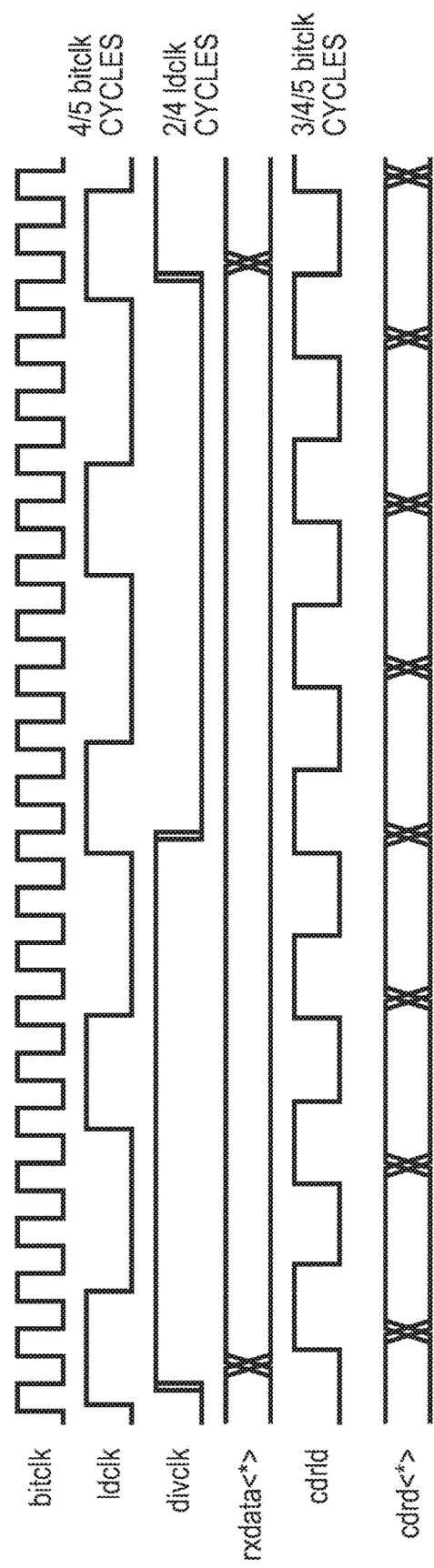
FIG. 3B is a timing diagram of the deserializer of FIG. 3A.

FIG. 3B is a timing diagram illustrating operation of the deserializer circuit 300 of FIG. 3A. With reference to FIG. 3A, the circuit 300 may utilize a number of different clock signals. In particular, the bitclk may operate at a high frequency matching (or comparable to) the rate of the serial data input at each pipe, and is used to clock the flip-flops of the input buffer 310. The ldclk (i.e., "load clock") may clock the input flip-flops of the output array 320, and may have a frequency being a division of the bitclk, where the division value corresponds to the number of bits of each partial word. Thus, the ldclk operates the inputs of the array 320 once per cycle of loading a partial word from the input buffer 310. The divided clock divclk may be yet a further division of the bitclk, where the division value corresponds to the number of bits of the word. The divclk may clock the output flip-flops of the output array, and enables the output of the word as the output signal rxdata once the word is fully loaded to the array 320.

For deserialization of a serial data input at a high rate, implementing the bitclk at a high frequency (e.g., 25 GHz), the input buffer 310 may include high-speed, "fast" flip-flops. In contrast, because the cells of the array 320 may be clocked via relatively slower, divided-down clock signals ldclk and divclk, the cells may include "slow" flip-flops that are smaller and consume less power than those of the input buffer 310.

The deserializer circuit 300 can provide several advantages. For example, by latching a partial word (rather than a full word) during each loading cycle, the circuit 300 can minimize the use of "fast" flip-flops, reducing the power and on-chip space consumed by the circuit 300. Further, the modular architecture of the circuit 300 provides an efficient, adaptable circuit that may be implemented in a range of different data protocols. In particular, the circuit 300 may be configured with an array 320 of m columns and n rows of the array to accommodate a selected number of specific word sizes. The configuration of the circuit 300 shown in FIG. 3, in one example, illustrates a 5×4 array, which can accommodate common word sizes of 8, 10, 16 and 20 bits (among other, less common word sizes) via variable array usage (e.g., m=[4,5], n=[2,4]). An array having different m×n dimensions may be implemented to accommodate other word sizes as required.

Further, when operating with a word size that is smaller than the capacity of the array 320, some cells of the array 320, along with one or more flip-flops of the input buffer 310, may be disabled. For example, under a 10-bit word configuration, rows 322c and 322d of the array 320 may be disabled. Under an 8-bit word configuration, in addition to disabling rows 322c and 322d, one column of the array 320 and input buffer 310 (i.e., one flip-flop of the input buffer 310 and the respective cells of rows 322a and 322b) may also be disabled. By selectively disabling cells of the array 320 and flip-flops of the input buffer 310 under some configurations, the circuit 300 may further reduce power consumption by the circuit 300.

Figure 4:
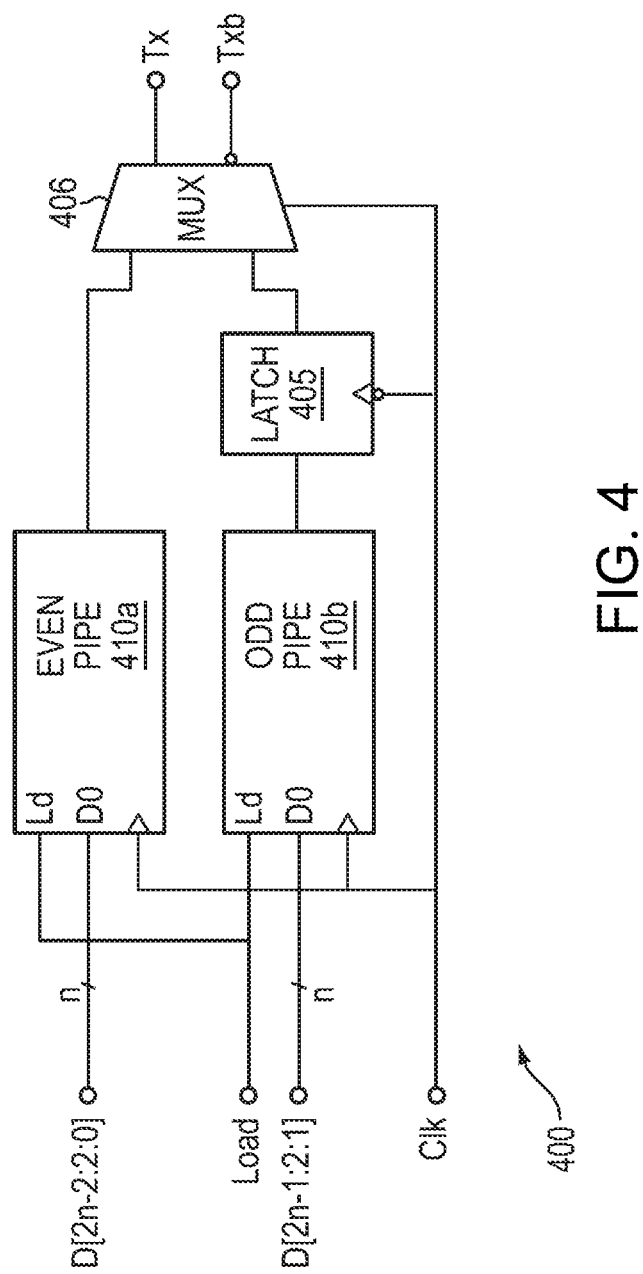
FIG. 4 is a circuit diagram of a serializer in which example embodiments may be implemented.

FIG. 4 is a circuit diagram of a serializer 400. The serializer 400 receives a parallel data signal D divided into two segments (D[2n−2:2:0] and D[2n−1:2:1]) to two serializer pipes 410a-b, respectively. Under a half-rate architecture, the parallel data signal is serialized at a distinct "pipe" at each of the two channels, where an "even" pipe 210a and an "odd" pipe 210b serialize data to be transmitted on opposite clock edges of the serial data output signal Tx. In order to align the timing of the serial data signal portions output by each pipe, the latch assembly may include a latch 405 at one channel as shown. Further division ratios may be achieved by appropriate circuitry. A multiplexer 406 combines the serial data output by each pipe to generate the serial data output signal Tx.

The pipes 410a-b may be clocked by clock signal Load to clock the parallel data input and the clock signal Clk to clock the serial data signal output. The even and odd pipes 410a-b serialize a portion of the parallel data signal D and output, concurrently, a respective portion of a serial data signal. Alternative embodiments may employ a single pipe, full-rate architecture for outputting the word.

A typical serializer pipe may include an input buffer and an output buffer. The input buffer may be comprised of a number of flip-flops, each of which receives a respective bit of the parallel data input. Specifically, bits of the parallel data input are clocked into the input buffer at a rate corresponding to that of the parallel data transmission. When a word is latched by the input buffer, it is transferred to the output buffer, which, in turn, outputs the word serially. The output buffer includes a number of flip-flops connected serially, and flip-flop is also connected to a respective flip-flop of the input buffer. When outputting the serial data signal, each flip-flop of the input buffer forwards its received bit to a successive flip-flop of the output buffer until it is transmitted by the last flip-flop in the chain.

The typical serializer described above exhibits a number of disadvantages. In order to latch an entire word, the input buffer must have a number of flip-flops equal to the number of bits of the word. Likewise, the output buffer must have the same number of flip-flops in order to receive the word from the input buffer. The output flip-flops must operate at a clock rate matching the rate of the serial data transmission. To meet this timing requirement for higher-speed data transmission, the output buffer must be implemented using "fast" flip-flops, which are larger and require more power to operate. The input buffer, in contrast, may be operated by smaller, lower-power "slow" flip-flops due to the lower rate of the data output. Yet the requirement of several fast flip-flops at the output buffer can result in excessive power consumption and occupation of on-chip space. Moreover, if the serializer is configured to operate with multiple different word sizes, then the output buffer must be large enough to accommodate the largest of the multiple words. Thus, even when operating with smaller words, the typical serializer may require a large number of "fast" flip-flops.

Figure 5A:
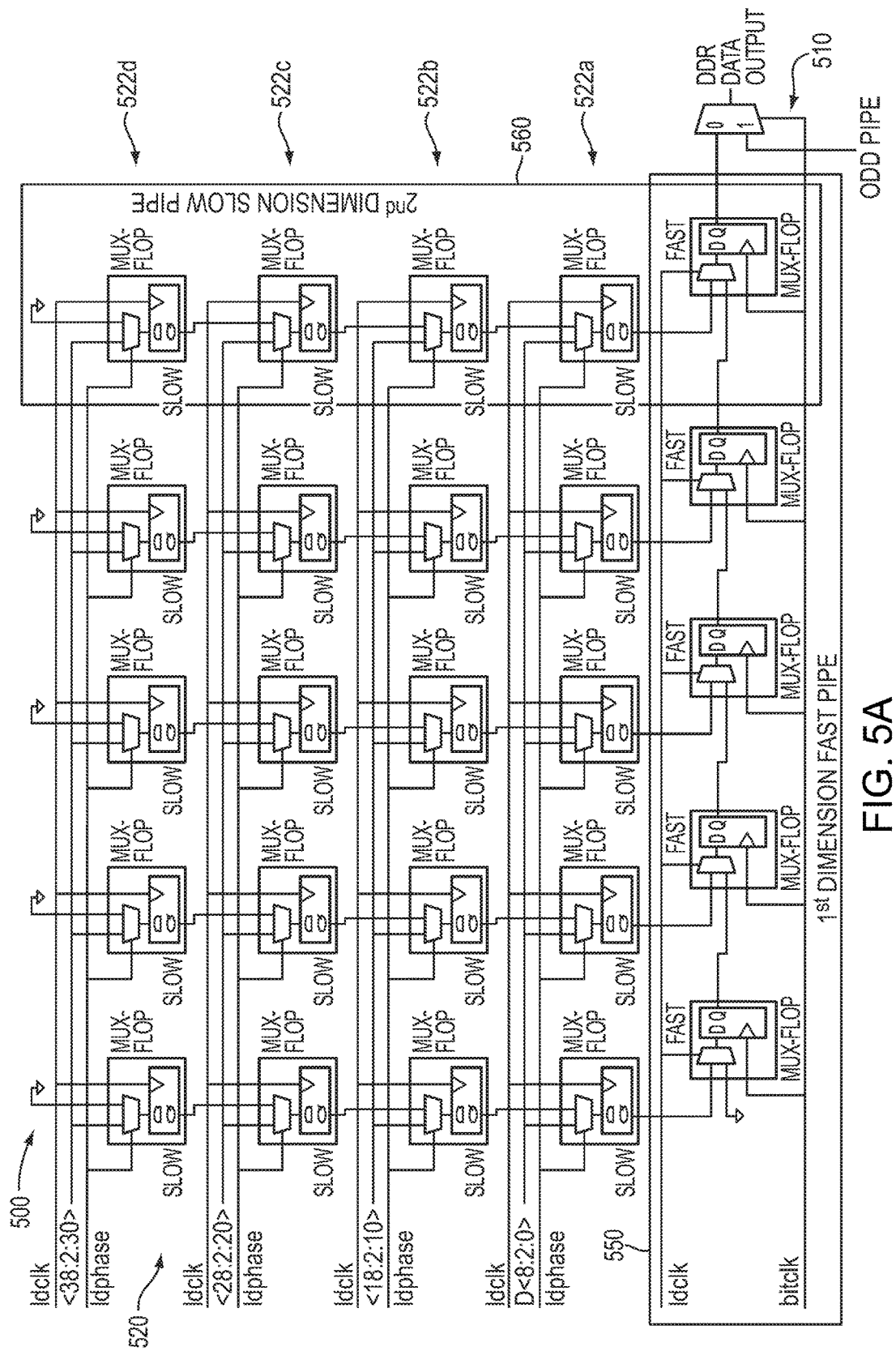
FIG. 5A is a circuit diagram of a serializer in one embodiment.

FIG. 5A is a circuit diagram of a serializer in one embodiment. The serializer 500 may be implemented in one or both of the serializer pipes 410a-b of FIG. 4. The input array 520 receives a parallel input signal, and may comprise a plurality cells (comprising a flip-flop and an input multiplexer) arranged in m rows 522a-d, where each row may have a width of n cells matching the number of flip-flops of an output buffer 510. Although the array 520 as shown is configured such that m=5 and n=4, the array 520 and output buffer 510 may be configured to include rows and columns of different sizes to accommodate different operational parameters, as described in further detail below. During an input phase, each active cell of the input array 520 may receive and latch a respective bit of the parallel input signal D, which makes up a word to be serialized. Thus, each active row 522a-d of the array may latch a partial word corresponding to a portion of the word.

Once the word is latched by the input array 520, the input array 520 may then transfer the word, successively as a series of the partial words, to the output buffer 510. The output buffer 510, which includes a number of cells (each comprising a flip-flop and multiplexer) connected in series, may be communicatively coupled to the first row 522a of the array 520 such that the flip-flop of each cell is connected to latch an output of a respective flip-flop of the input buffer. To begin loading the output buffer 510, the first row 522a may transfer its latched partial word, in parallel, to the output buffer 520. The output buffer 520 then begins transferring the word, beginning with this partial word, as a serial data output (which may be multiplexed with one or more additional serializer pipes). Concurrently, each of the rows 522b-d of the array 520 may transfer its partial word to the preceding row (e.g., the flip-flops of row 522a receive and latch the output of the flip-flops of row 522b), enabling the first row 522a to transfer each of the partial words to the output buffer 520 in subsequent cycles. The output buffer 520 outputs each of the partial words in succession until the complete word is output as a component of the serial data output signal. The flip-flops of the output buffer 510 may be clocked by a clock signal bitclk having a rate equal or comparable to the rate of the serial data output, and the partial word may occupy some or all of the flip-flops of the output buffer 510.

Thus, in order to load a word into the output buffer 510 for transmission, the input array 520 may receive multiple partial words of the word and transfer the partial words successively to the output buffer 510 via the first row 522a of the array 520. The partial words may be transferred, from row to row, down the array 520 until the output buffer 510 has latched and transferred all of the partial word. The output buffer 520 may output the partial words successively as a serial data output. As such, the circuit 500 may be viewed as comprising a "fast pipe" 550 made up of the output buffer 510, and a number of "slow pipes" (e.g., pipe 560), each made up of a column of the input array 520, which transfer bits to a respective flip-flop of the output buffer 510.

In further embodiments, two or more of the circuits 500 may be implemented in respective pipes of a serializer system, such as the pipes 410*a-b* described above with reference to FIG. 4. In such an implementation, under the half-rate architecture described above, the even and odd pipes 410*a-b* may each employ a separate embodiment of the circuit 500 to serialize a portion of the data signal D and output, serially, a respective portion of the word corresponding to the data. The word may have a length equal to the number of bits output by the pipes 410*a-b* in parallel (e.g., 2*m*n). Thus, the two circuits 500 of the respective pipes 410*a-b* may serialize data occurring on opposite clock edges of the data signal Rx. In such an embodiment, the serial data output by each of the plural circuits 500 may be a portion of the total output, which is combined with the output of the other serializer circuit(s) to provide the complete serial output signal. In further embodiments, one or more parallel data signals may be divided among a plurality of serializer circuits such as the circuit 500, and the outputs of the plurality of serializer circuits may be combined to constitute the serial data output. By implementing a half-rate or other divided rate architecture, the plural serializer circuits may be configured to serialize successive bits of a parallel data signal in an alternating manner, enabling a serializer system to generate higher rate serial data signals.

Figure 5B:
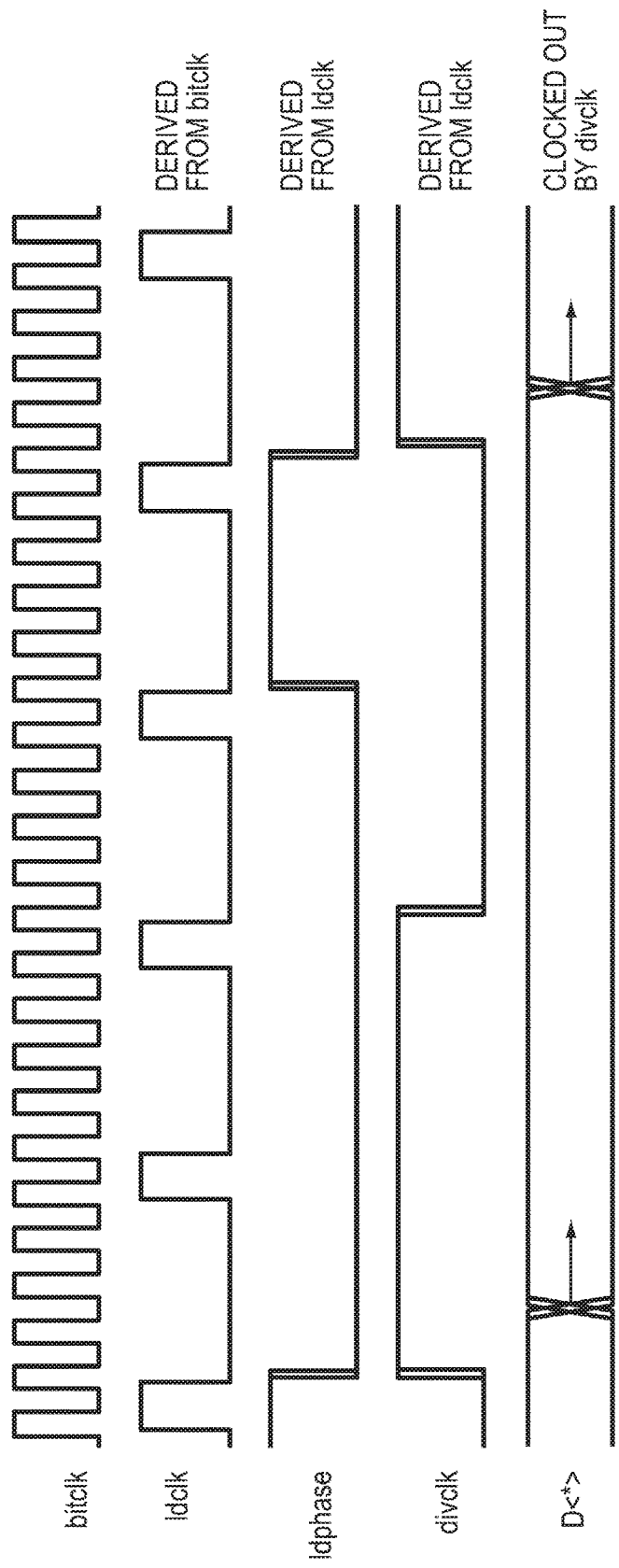
FIG. 5B is a timing diagram of the serializer of FIG. 5A.

FIG. 5B is a timing diagram illustrating operation of the serializer circuit 500 of FIG. 5A. With reference to FIG. 5A, the circuit 500 may utilize a number of different clock signals. In particular, the bitclk may operate at a high frequency matching (or comparable to) the rate of the serial data input, and is used to clock the flip-flops of the output buffer 510. The ldclk (i.e., "load clock") may clock the flip-flops of the input array 520, and may have a frequency being a division of the bitclk, where the division value corresponds to the number of bits of each partial word. Thus, the ldclk operates the inputs of the array 520 once per cycle of transferring the partial words toward the output buffer 510. Clock signal ldphase (i.e., "load phase") may clock the multiplexer of each cell of the input array 520, thereby selecting between loading the respective flip-flops with the parallel data input or the bit of a successive row of the array 520. Clock signal Divclk may be used as a timing reference for the data source for the serializer.

For serialization of a serial data input at a high rate, implementing the bitclk at a high frequency (e.g., 25 GHz), the output buffer 510 may include high-speed, "fast" flip-flops. In contrast, because the cells of the array 520 may be clocked via relatively slower, divided-down clock signals ldclk and ldphase, the cells may include "slow" flip-flops that are smaller and consume less power than those of the output buffer 510.

The serializer circuit 500 can provide several advantages. For example, by outputting a partial word (rather than a full word) during each loading cycle, the circuit 500 can minimize the use of "fast" flip-flops, reducing the power and on-chip space consumed by the circuit 500. Further, the modular architecture of the circuit 500 provides an efficient, adaptable circuit that may be implemented in a range of different data protocols. In particular, the circuit 500 may be configured with an array 520 of m columns and n rows of the array to accommodate a selected number of specific word sizes. The configuration of the circuit 500 shown in FIG. 5, in one example, illustrates a 5×4 array, which can accommodate common word sizes of 8, 10, 16 and 20 bits (among other, less common word sizes) via variable array usage (e.g., m=[4,5], n=[2,4]). An array having different m×n dimensions may be implemented to accommodate other word sizes as required.

Further, when operating with a word size that is smaller than the capacity of the array 520, some cells of the array 520, along with one or more flip-flops of the output buffer 510, may be disabled. For example, under a 10-bit word configuration, rows 522*c* and 522*d* of the array 520 may be disabled. Under an 8-bit word configuration, in addition to disabling rows 522*c* and 522*d*, one column of the array 520 and output buffer 510 (i.e., one flip-flop of the output buffer 510 and the respective cells of rows 522*a* and 522*b*) may also be disabled. By selectively disabling cells of the array 520 and flip-flops of the output buffer 510 under some configurations, the circuit 500 may further reduce power consumption by the circuit 500.

Figure 6A:
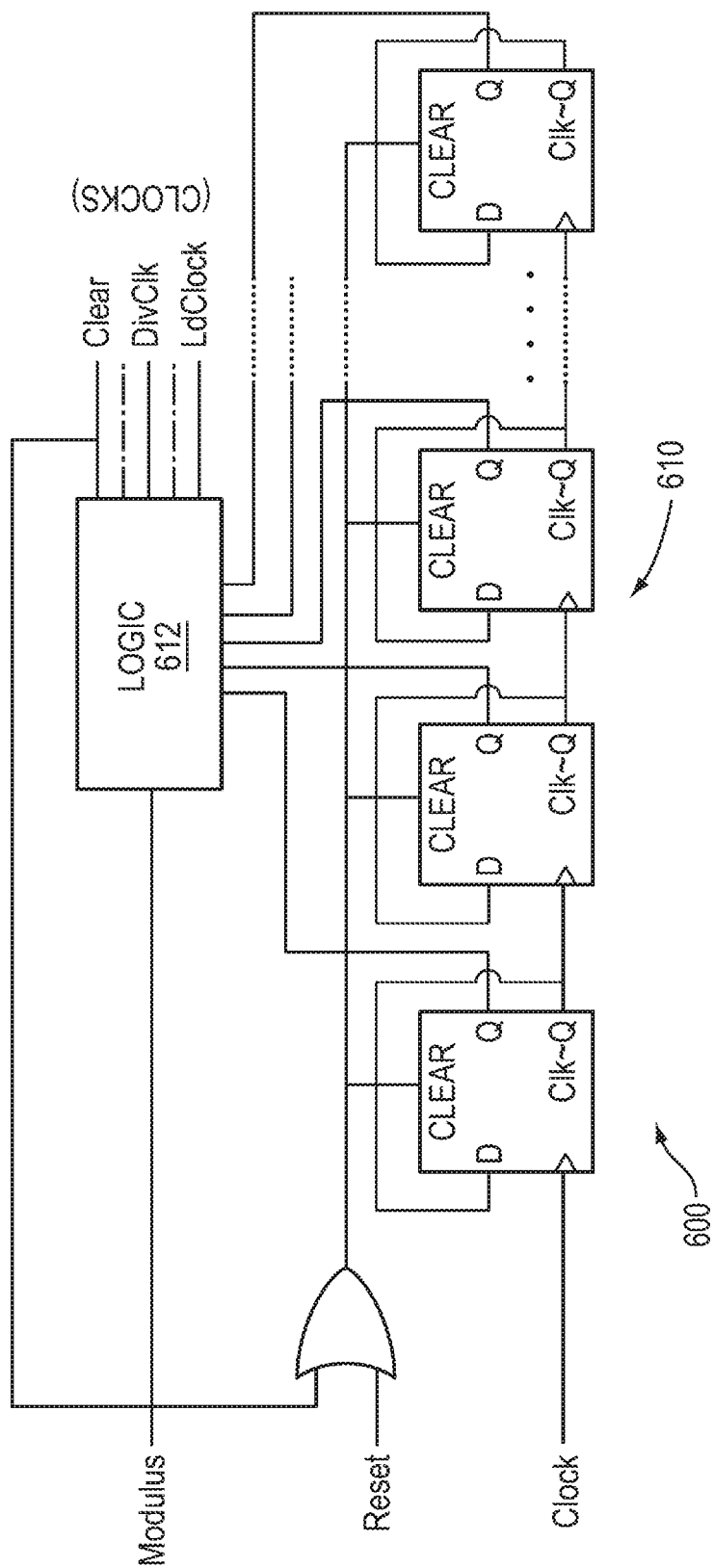
FIG. 6A is a circuit diagram of a clock generator for clocking a serializer or deserializer.
Figure 6B:
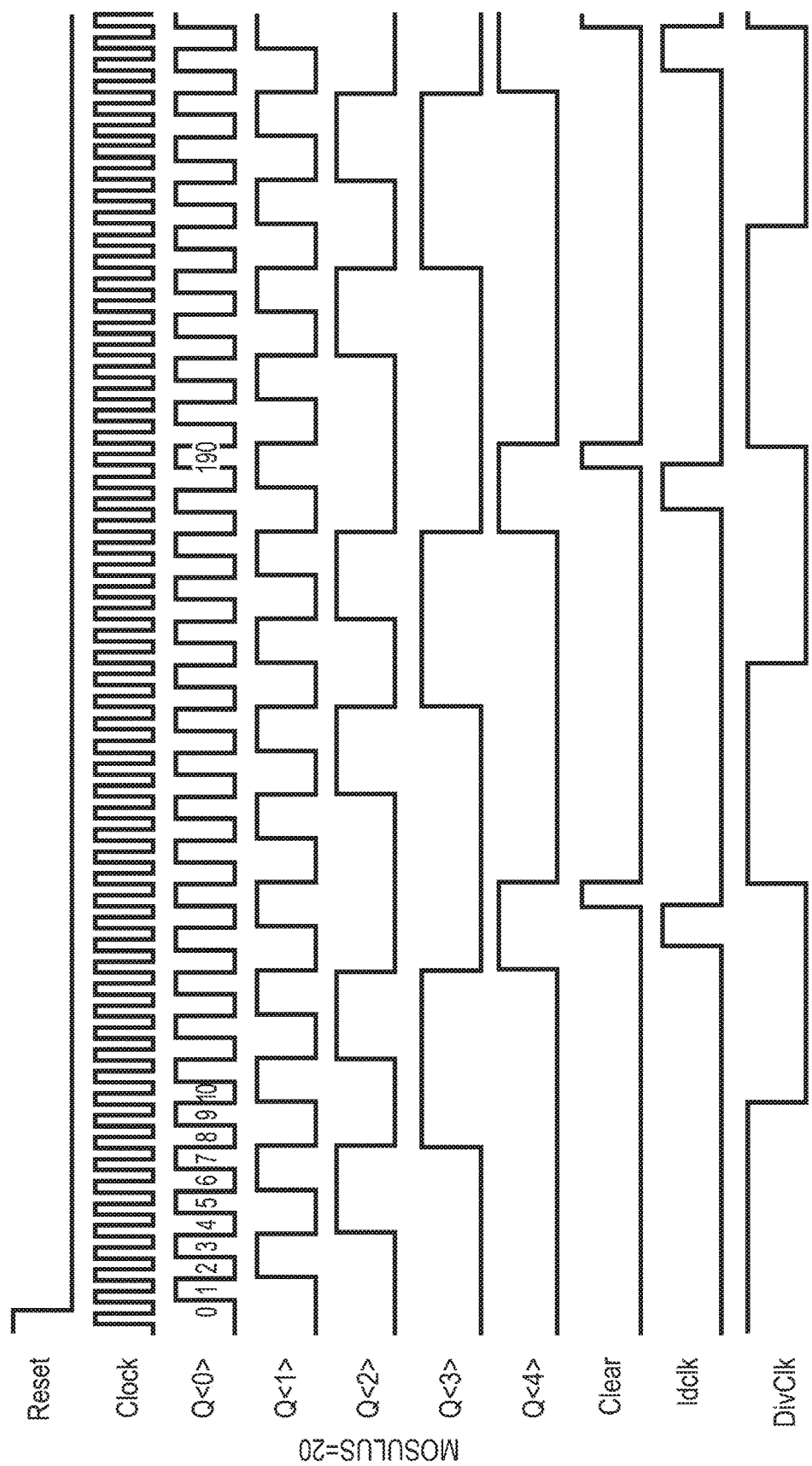
FIG. 6B is a timing diagram of the clock generator of FIG. 6A.

FIG. 6A is a circuit diagram of a clock generator 600 that may be implemented to generate the clock signals of the serializer and/or deserializer circuits described above with reference to FIGS. 1-5. The clock generator 600 may include an arrangement of flip-flops 610 configure to operate as a ripple counter generating a plurality of states. A logic circuit 612 is communicatively coupled with the flip-flops 610, and operates to feed back a synchronous clear signal, create derived clock signals from counter states of the ripple counter, and output the plural clock signals (e.g., ldclk, divclk) required for the serializer and/or deserializer. A timing diagram illustrating the respective clock signals generated by the clock generator 600 is illustrated in FIG. 6B.

In order to generate the plural distinct clock signals, the logic circuit 612 may implement complex logic circuitry, which may introduce adverse effects when operating at higher clock speeds. In particular, multi-bit comparisons may be required to generate the synchronous clear and derived clock signals, and the deeper logic depth required for such comparisons may cause the logic circuit 612 to operate excessively slowly. Although the logic circuit 612 can be optimized for specific clock divisions, this optimization may be gained at the cost of reconfigurability for different clock requirements.

Figure 7A:
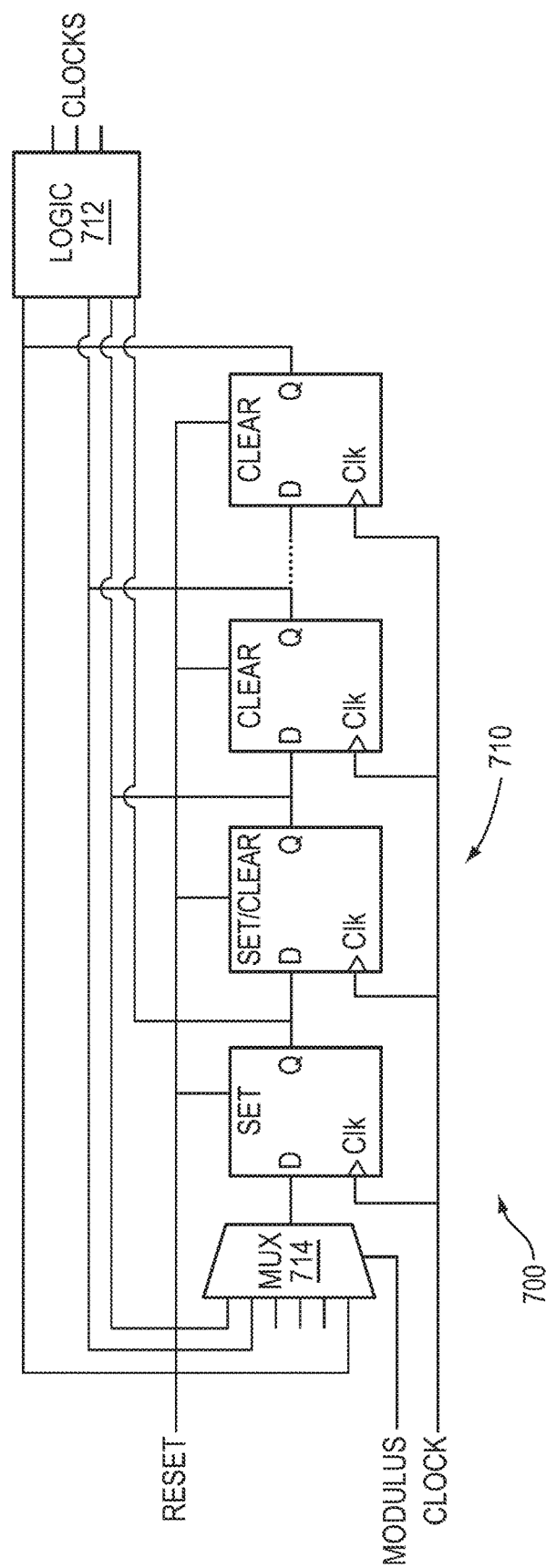
FIG. 7A is a circuit diagram of a clock generator in one embodiment.

FIG. 7A is a circuit diagram illustrating a modular clock generator 700 in one embodiment. The clock generator 700 includes a shift register 710 (comprising plural flip-flops connected in series), a multiplexer 714 selecting the input to the shift register 710, and a logic circuit 712 coupled to nodes connecting the output of each flip-flop of the register 710 and inputs of the multiplexer 714.

Figure 7B:
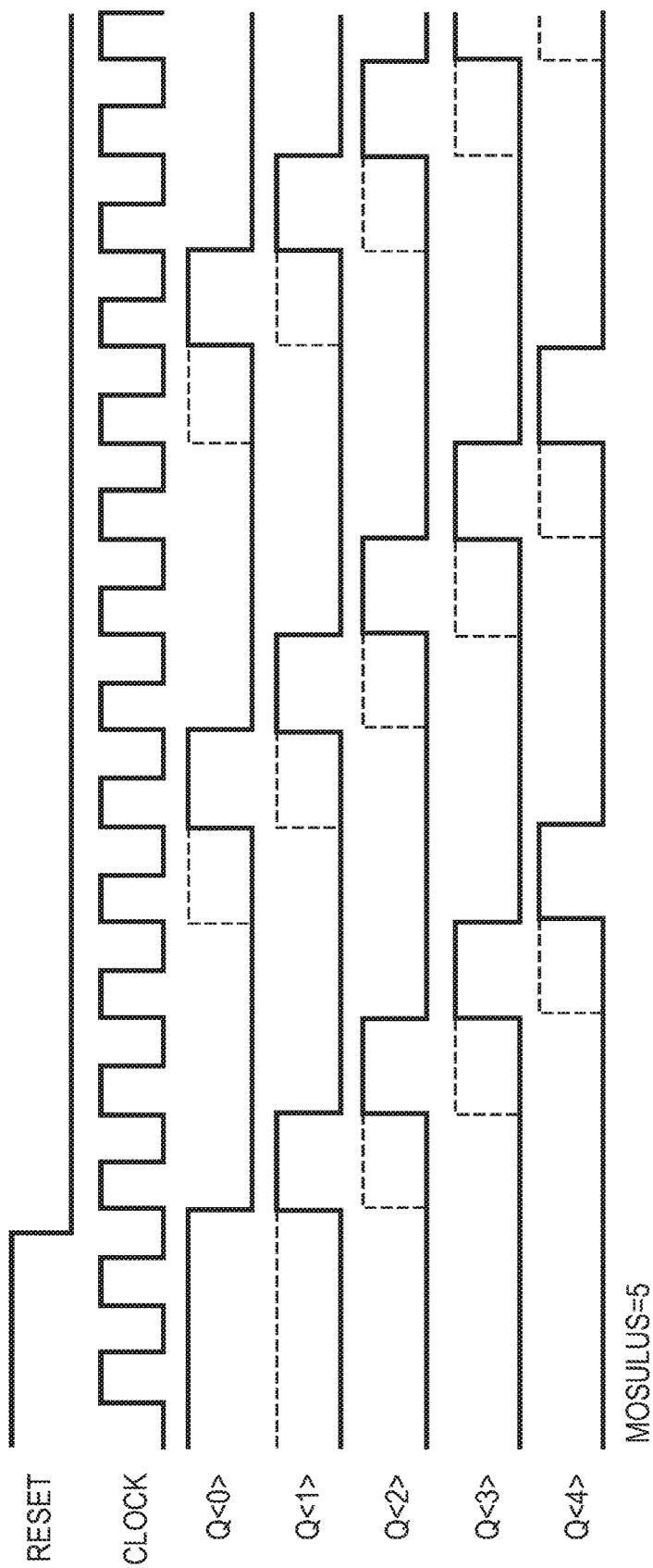
FIG. 7B is a timing diagram of the clock generator of FIG. 7A.

As shown in the timing diagram of FIG. 7B, each flip-flop of the shift register 710 generates a respective state (Q<0>-Q<4>). The logic circuit 712, based on the required clock outputs, selects a feedback point (via multiplexer select signal "modulus") to control the cycle width of the generator 700, and the duty cycle of the count may be determined by the set and clear configuration of the flip-flops of the register 710. Thus, the logic circuit may implement relatively simple logic to control the multiplexer and shift register to generate a plurality of clock signals.

Figure 8A:
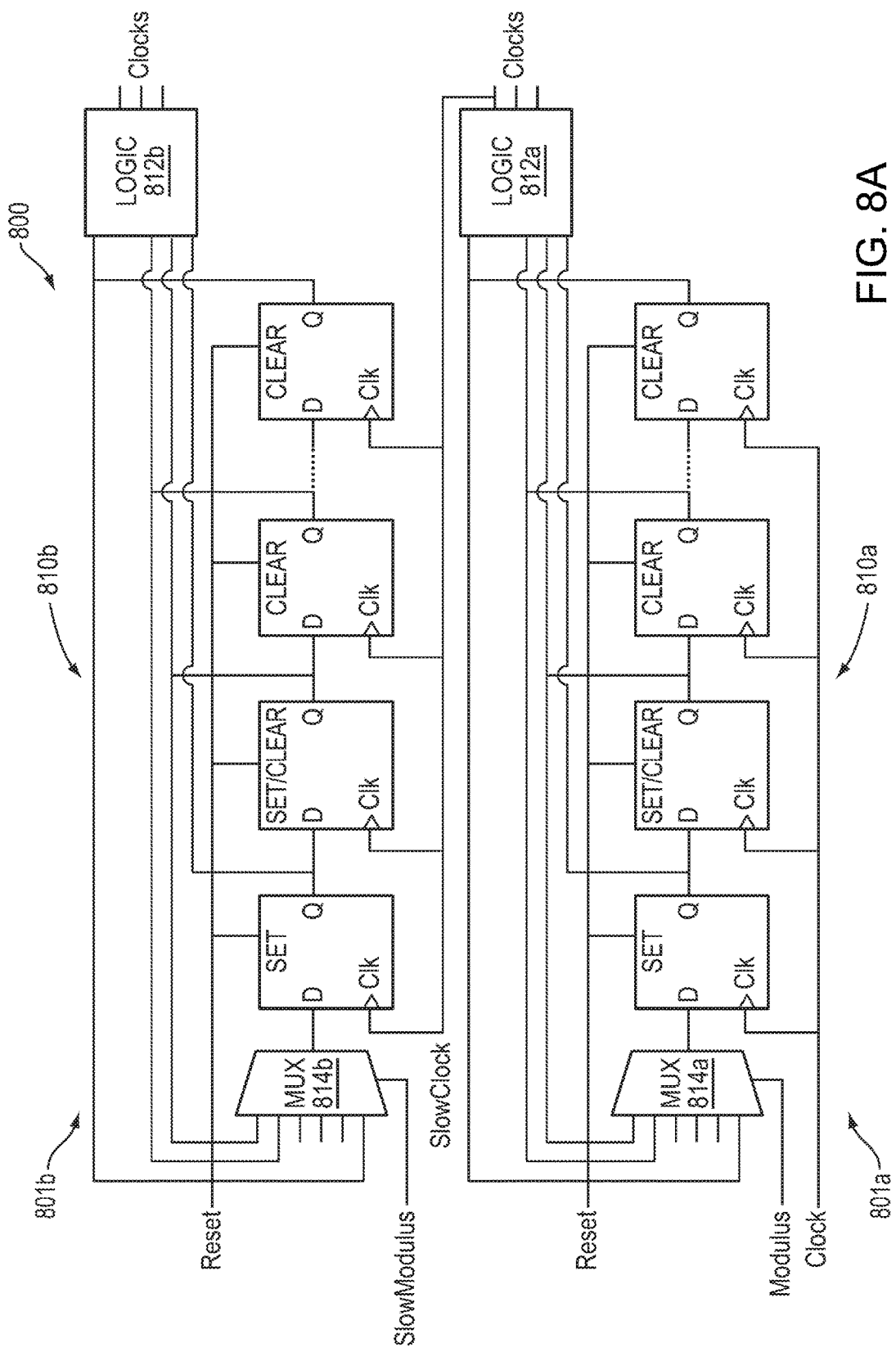
FIG. 8A is a circuit diagram of a clock generator in a further embodiment.
Figure 8B:
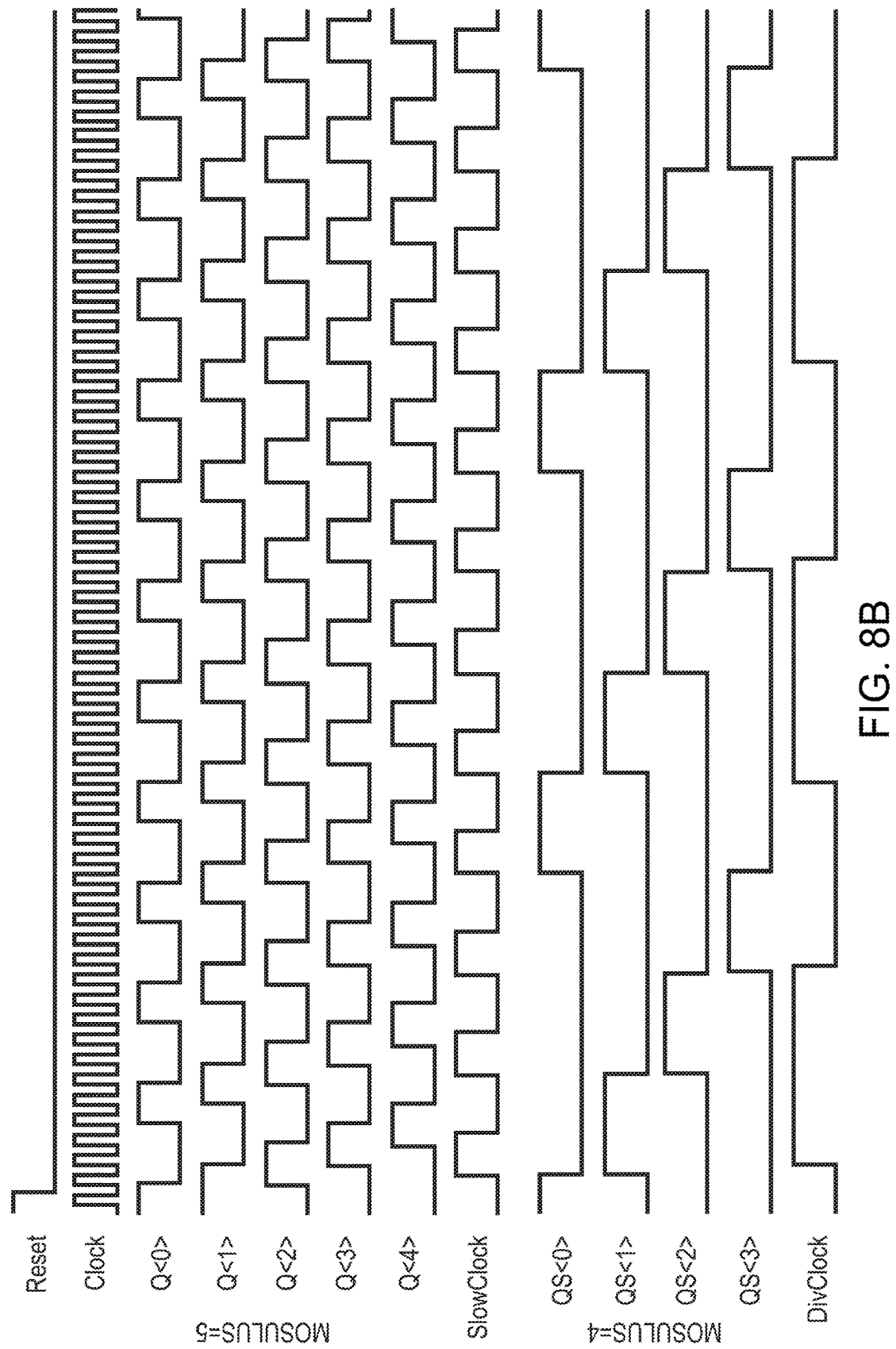
FIG. 8B is a timing diagram of the clock generator of FIG. 8A.

FIG. 8A is a circuit diagram illustrating a modular clock generator 800 in a further embodiment. The clock generator 800 may be implemented to generate the clock signals of the serializer and/or deserializer circuits described above with reference to FIGS. 1-5. The clock generator 800 may include a plurality of sub-generators 801*a-b*, where each sub-generator may incorporate the features of the clock generator 700 described above with reference to FIG. 7A, including a shift register 810*a-b*, a multiplexer 814*a-b*, and a logic circuit 812*a-b*. However, the first sub-generator 801*a* may be configured to provide a slower clock output ("slow-clock") to clock the shift register 810*b* of the second sub-generator 801*b*. As a result, the first and second sub-generators 801*a-b* may each provide a distinct, reconfigurable set of clock signals, where the second sub-generator 801*b* may generate a slower clock signal output that is divided down from the output of the first sub-generator 801*a*. An example plurality of clock signals generated by the clock generator 800 is illustrated by the timing diagram of FIG. 8B.

The clock generator 800 provides a number of advantages. For example, the number of sub-generators implemented, as well as the number of flip-flops of each shift register, may be configured based on the clock requirements of one or more serializer and deserializer circuits. Specifically, when a value m corresponds to the number of sub-generators and a value n corresponds to a number of flip-flops of a shift register, m and n can be selected to accommodate a range of different divide ratios to generate different clock signals (e.g., m=[4,5]; n=[2,4]). Such configurations may provide for generating clock signals to clock, for example, 8, 10, 16, or 20-bit pipes to provide a combined 16, 20, 32, or 40-bit total operation of a deserializer and/or serializer. Further, portions of the clock generator 800 that are not used under a given configuration may be disabled, thereby reducing power consumption by the clock generator 800.

While example embodiments have been particularly shown and described, it will be understood by those skilled in the art that various changes in form and details may be made therein without departing from the scope of the embodiments encompassed by the appended claims.

What is claimed is:

1. A deserializer circuit, comprising:
    an input buffer configured to receive a serial data signal; and
    an array of cells, each cell comprising an input flip-flop and an output flip-flop, the array of cells including:
    a bottom row of cells configured to receive a plurality of partial words in parallel from the input buffer to the input flip-flops of the bottom row of cells, the plurality of partial words corresponding to the serial data signal;
    at least one intermediary row of cells configured to 1) receive the plurality of partial words from a preceding row of cells, and 2) transfer a subset of the plurality of partial words to a successive row of cells of the array of cells; and
    a top row of cells configured to receive one of the plurality of partial words from a preceding row of cells of the array of cells;
    the array of cells outputting a word in parallel via the output flip-flops, the word corresponding to the plurality of partial words.

2. The circuit of claim 1, wherein the input buffer and array of cells are grouped into a plurality of pipes, each pipe receiving a portion of the serial data signal in an alternating sequence.

3. The circuit of claim 2, wherein the plurality of pipes includes first and second pipes, the first pipe configured to receive the serial data signal at a first clock edge, the second pipe configured to receive the serial data signal at a second clock edge immediately succeeding the first clock edge.

4. The circuit of claim 1, wherein the input buffer includes a row of flip-flops connected serially via respective inputs and outputs.

5. The circuit of claim 4, wherein the row of flip-flops is configured to operate at a rate of at least 10 GHz, and the input and output flip-flops are configured to operate at a rate of less than or equal to 10 GHz.

6. The circuit of claim 4, wherein the flip-flops of the input buffer are clocked by a first clock signal and the flip-flops of the array of cells are clocked by a second clock signal, the second clock signal having a frequency being a fraction of a frequency of the first clock signal.

7. The circuit of claim 6, wherein the multiple is a value corresponding to the number of flip-flops of the input buffer.

8. The circuit of claim 6, further comprising a clock generator configured to generate the second clock signal, the clock generator comprising:
    a first row of flip-flops connected serially and clocked by the first clock signal;
    a second row of flip-flops connected serially and clocked by a signal corresponding to an output of the first row of flip-flops; and
    a controller configured to 1) output the second clock signal as a function of at least one output of the first row of flip-flops, and 2) output a third clock signal as a function of at least one output of the second row of flip-flops.

9. The circuit of claim 8, wherein the array of cells outputs the word as a function of the third clock signal.

10. The circuit of claim 1, further comprising a supplemental row of flip-flops configured to receive the plurality of partial words in parallel from the input buffer and output the plurality of words successively.

11. The circuit of claim 1, wherein the input buffer includes a row of n flip-flops and the array of cells includes n rows of m cells, where m*n equals the number of bits in the word.

12. A serializer circuit, comprising:
    an array of cells, each cell comprising a flip-flop, the array of cells including:
    a top row of cells configured to 1) receive a first partial word in parallel from a parallel data input and 2) transfer the first partial word in parallel to a successive row of the array;
    at least one intermediary row of cells, each configured to 1) receive a second partial word from the parallel data input, 2) transfer the second partial word to a successive row of the array, and 3) transfer the first partial word from a preceding row of the array to the successive row of the array; and
    a bottom row of cells configured to 1) receive a third partial word from the parallel data input and 2) receive a plurality of partial words, including the first and second partial words, in parallel from a preceding row of the array; and
    an output buffer configured to receive the plurality of words in parallel and sequentially from the bottom row of cells, the output buffer serially outputting a word corresponding to the plurality of partial words.

13. The circuit of claim 12, wherein the output buffer and array of cells are grouped into a plurality of pipes, each pipe receiving a portion of the word via the parallel data input.

14. The circuit of claim 13, wherein the plurality of pipes includes first and second pipes, the first pipe configured to transmit a first portion of the word serially at a first clock edge, the second pipe configured to transmit a second portion of the word serially at a second clock edge immediately succeeding the first clock edge.

15. The circuit of claim 12, wherein the output buffer includes a row of flip-flops connected serially via respective inputs and outputs.

16. The circuit of claim 15, wherein the row of flip-flops is configured to operate at a rate of at least 10 GHz, and the flip-flops of the array of cells are configured to operate at a rate of less than or equal to 10 GHz.

17. The circuit of claim 15, wherein the flip-flops of the output buffer are clocked by a first clock signal and the flip-flops of the array of cells are clocked by a second clock signal, the first clock signal having a frequency higher than and a multiple of a frequency of the second clock signal.

18. The circuit of claim 17, wherein the multiple is a value corresponding to the number of flip-flops of the input buffer.

19. The circuit of claim 17, further comprising a clock generator configured to generate the second clock signal, the clock generator comprising:
- a first row of flip-flops connected serially and clocked by the first clock signal;
- a second row of flip-flops connected serially and clocked by a signal corresponding to an output of the first row of flip-flops; and
- a controller configured to 1) output the second clock signal as a function of at least one output of the first row of flip-flops, and 2) output a third clock signal as a function of at least one output of the second row of flip-flops.

20. The circuit of claim 19, wherein the array of cells receives the plurality of partial words as a function of the third clock signal.

21. The circuit of claim 12, wherein a subset of the plurality of cells further includes a multiplexer configured to switch an output between the parallel data input and an output of a cell of a preceding row, the multiplexer transferring the output to and input of the respective flip-flop.

22. The circuit of claim 12, wherein the output buffer includes a row of n flip-flops and the array of cells includes m rows of n cells, where m*n equals the number of bits in the word.

23. A deserializer circuit, comprising:
- an input buffer configured to latch a plurality of partial words in succession from a serial data signal; and
- an array of cells, each cell comprising an input flip-flop and an output flip-flop, the array of cells being configured to receive the plurality of partial words in succession from the input buffer to the input flip-flops, the array of cells being further configured to output a word in parallel via the output flip-flops, the word corresponding to the plurality of partial words;
- the array of cells including at least a first row of cells and a second row of cells, the first row of cells being configured to receive the plurality of partial words in parallel from the input buffer, the second row of cells being configured to receive the plurality of partial words from the first row of cells.

24. The circuit of claim 23, wherein the input buffer includes a row of n flip-flops and the array of cells includes n rows of m cells, where m*n equals a number of bits in the word.

25. A serializer circuit, comprising:
- an array of cells, each cell comprising a flip-flop, the array of cells being configured to receive a plurality of partial words in parallel, each row of the array of cells latching a respective one of the plurality of partial words; and
- an output buffer configured to receive the plurality of words in parallel and sequentially from a bottom row of the array of cells, the output buffer serially outputting a word corresponding to the plurality of partial words;
- the array of cells including at least a first row of cells and a second row of cells, the first row of cells being configured to 1) receive a first partial word in parallel from a parallel data input and 2) transfer the first partial word in parallel to the second row of cells, the second row of cells being configured to receive a second word in parallel from the parallel data input.

26. The circuit of claim 25, wherein the output buffer includes a row of n flip-flops and the array of cells includes m rows of n cells, where m*n equals a number of bits in the word.

* * * * *